United States Patent
Ebner et al.

(10) Patent No.: US 8,031,098 B1
(45) Date of Patent: Oct. 4, 2011

(54) DAC CIRCUIT WITH PSEUDO-RETURN-TO-ZERO SCHEME AND DAC CALIBRATION CIRCUIT AND METHOD

(75) Inventors: Christian Ebner, München (DE); Jipeng Li, Windham, NH (US); Bernd Schafferer, Gloucester, MA (US)

(73) Assignee: National Semiconductor Corporation, Santa Clara, CA (US)

( * ) Notice: Subject to any disclaimer, the term of this patent is extended or adjusted under 35 U.S.C. 154(b) by 82 days.

(21) Appl. No.: 12/689,874

(22) Filed: Jan. 19, 2010

(51) Int. Cl.
*H03M 1/72* (2006.01)

(52) U.S. Cl. ........................................ 341/146; 341/144

(58) Field of Classification Search .......... 341/144–146, 341/118, 120, 143
See application file for complete search history.

(56) References Cited

U.S. PATENT DOCUMENTS

| | | | |
|---|---|---|---|
| 5,182,559 A * | 1/1993 | Tokuyama | 341/144 |
| 5,355,134 A * | 10/1994 | Kasuga et al. | 341/144 |
| 5,594,443 A * | 1/1997 | Lam | 341/144 |
| 6,507,304 B1 | 1/2003 | Lorenz | |
| 6,642,867 B1 | 11/2003 | Chowdhury et al. | |
| 6,842,132 B2 | 1/2005 | Schafferer | |
| 2003/0043062 A1 | 3/2003 | Dedic et al. | |

OTHER PUBLICATIONS

Analog Devices Data Sheet for "AD9734/AD9735/AD9736." 10-/12-/14-Bit, 1200 MSPS DACS, © 2006 Analog Devices, Inc., 72 pages.
Analog Devices Data Sheet for "AD9776A/AD9778A/AD9779A," Dual, 12-/14-/16-Bit, 1 GSPS, Digital-to-Analog Converters, © 2007-2008 Analog Devices, Inc., 56 pages.

* cited by examiner

*Primary Examiner* — Brian Young
(74) *Attorney, Agent, or Firm* — Patent Law Group LLP; Carmen C. Cook (57) ABSTRACT

In one embodiment, digital-to-analog converter (DAC) circuit includes dual DAC units employing pseudo-return-to-zero DAC operations to reduce inter-symbol interference. Moreover, each DAC unit is implemented using complementary MOS transistors to improve conversion performance. In another embodiment, a DAC calibration scheme performs background calibration of an array of DAC circuits in continuous time using a reference DAC circuit and a spare DAC circuit. Calibration (also referred to as "trimming") of the DAC circuit using the calibration scheme of the present invention ensures that the DAC operates with high linearity over process variations. In one embodiment, the DAC circuit and the DAC calibration scheme are applied as the feedback DAC in a continuous-time sigma-delta (CT-ΣΔ) analog-to-digital converter to realize high performance and high precision analog-to-digital conversions.

23 Claims, 5 Drawing Sheets

DAC CIRCUIT WITH PSEUDO-RETURN-TO-ZERO SCHEME AND DAC CALIBRATION CIRCUIT AND METHOD

FIELD OF THE INVENTION

The invention relates to analog-to-digital conversion systems and, in particular, to a feedback digital-to-analog converter (DAC) calibration circuit and method for a continuous-time sigma-delta analog-to-digital converter.

DESCRIPTION OF THE RELATED ART

Analog-to-digital converters (ADC) are used in converting or digitizing an analog input signal to generate a digital output signal indicative of the value of the analog input signal within a given conversion time. Continuous-time sigma-delta (CT-ΣΔ) analog-to-digital converters refer to a class of converters employing oversampling and noise shaping to achieve high resolution and high efficiency conversions. CT-ΣΔ ADCs are more power efficient and can operate at lower sampling rate than other analog-to-digital conversion schemes, and are being increasingly applied in high speed, high dynamic performance systems.

In general, a sigma-delta (ΣΔ) analog-to-digital conversion system includes a sigma-delta (ΣΔ) modulator followed by a decimation filter. The ΣΔ modulator is formed by a loop filter and a quantizer configured in a feedback loop including a digital-to-analog converter (DAC) to shape the quantization noise such that most of the noise is shifted out of the frequency band of interest, where the out-of-band noise can be filtered out subsequently. The output signal of the ΣΔ modulator is provided to the decimation filter to remove the out-of-band quantization noise and downsample the output to the desired data rate.

Sigma-delta (ΣΔ) analog-to-digital conversion systems can be formed as a discrete-time ΣΔ ADC using a discrete-time loop filter or as a continuous-time ΣΔ ADC using a continuous-time loop filter. The continuous-time ΣΔ ADC provides advantages over the discrete-time converter in that the continuous-time ΣΔ ADC can operate at lower power, include inherent anti-aliasing filtering and a low noise input stage.

SUMMARY OF THE INVENTION

According to one embodiment of the present invention, a digital-to-analog converter (DAC) circuit includes a first digital-to-analog converter (DAC) unit having a first input terminal coupled to receive a first signal related to a digital input signal and an output terminal coupled to provide an analog output signal; a second DAC unit having a first input terminal coupled to receive a second signal related to the digital input signal and an output terminal coupled to provide an analog output signal, the analog output signals from the first and second DAC units being summed at a summing node; and a first latch and a second latch connected in series. The first latch is coupled to latch the digital input signal based on a first clock signal and to generate the first signal where the first latch provides the first signal to the first DAC unit and to the second latch. The second latch is coupled to latch the first signal based on a second clock signal and to generate the second signal where the second latch provides the second signal to the second DAC unit. The first and second clock signals are non-overlapping clock signals. In operation, the first DAC unit is enabled during a first half of a conversion clock cycle and is reset during a second half of the conversion clock cycle and the second DAC unit is reset during the first half of the conversion clock cycle and is enabled during the second half of the conversion clock cycle. The summed analog output signal from the first and second DAC units over a conversion clock cycle is an analog output signal of the DAC circuit based on the digital input signal.

According to another embodiment of the present invention, a method for calibrating an array of M digital-to-analog converter (DAC) circuits where the M DAC circuits are coupled to convert a digital input signal having M number of quantization levels into an analog output signal includes providing a reference DAC circuit and a spare DAC circuit, both identical to the M DAC circuits where the reference DAC circuit provides an analog output signal having a reverse polarity as the spare DAC circuit; connecting output terminals of the M DAC circuits and the reference and spare DAC circuits to an analog output terminal without intervening switches; summing output signals from the M DAC circuit and the reference and spare DAC circuits at the output terminal to generate the analog output signal of the array where the output signal of the reference DAC circuit cancels the output signal of the spare DAC circuit; selecting one of M DAC circuits for calibration, the selected DAC circuit becoming a calibration DAC circuit; configuring the spare DAC circuit and the remaining M−1 DAC circuits as the array of M DAC circuits coupled to convert the digital input signal into the analog output signal; providing a calibration signal to an input terminal of the reference DAC circuit and the calibration DAC circuit; integrating the output signal of the reference DAC circuit and the output signal of the calibration DAC circuit over a predetermined number of clock cycles; comparing the integrated output signal of the reference DAC circuit and the integrated output signal of the calibration DAC circuit; and generating a calibration control signal to modify a timing parameter in the calibration DAC circuit.

The present invention is better understood upon consideration of the detailed description below and the accompanying drawings.

DETAILED DESCRIPTION OF THE PREFERRED EMBODIMENTS

In accordance with the principles of the present invention, a digital-to-analog converter (DAC) circuit includes dual DAC units employing pseudo-return-to-zero DAC operations to reduce inter-symbol interference. Moreover, each DAC unit is implemented using complementary MOS transistors to improve conversion performance. According to another aspect of the present invention, a DAC calibration scheme exploits the return-to-zero time interval of the DAC operations to perform background calibration of an array of DAC circuits in continuous time. Calibration (also referred to as "trimming") of the DAC circuit using the calibration scheme of the present invention ensures that the DAC operates with high linearity over process variations. In one embodiment, the DAC circuit and the DAC calibration scheme are applied as the feedback DAC in a continuous-time sigma-delta (CT-ΣΔ) analog-to-digital converter to realize high performance and high precision analog-to-digital conversions.

Continuous-Time ΣΔ ADC

Figure 1:
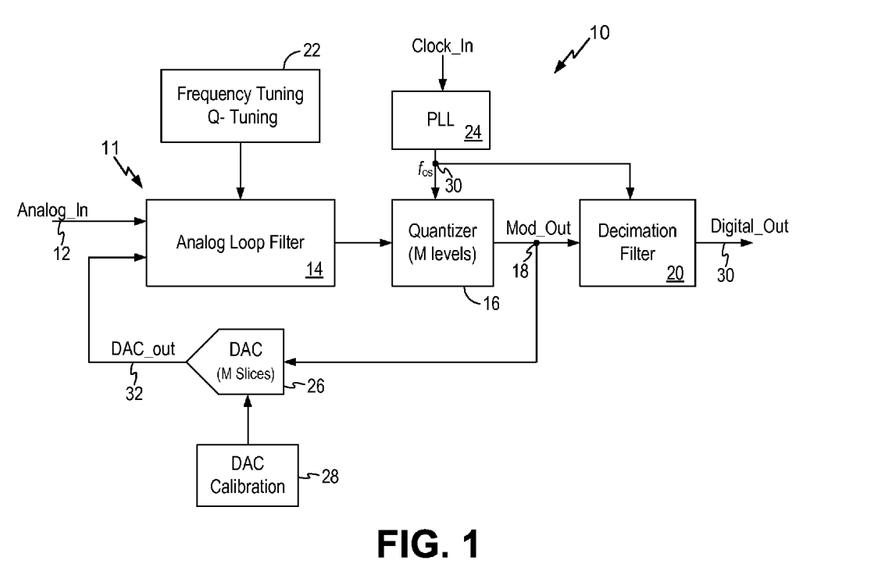
FIG. 1 is a block diagram of a continuous-time sigma-delta (CT-ΣΔ) analog-to-digital converter incorporating a feedback DAC with DAC trimming according to one embodiment of the present invention.

FIG. 1 is a block diagram of a continuous-time sigma-delta (CT-ΣΔ) analog-to-digital converter incorporating a feedback DAC with DAC trimming according to one embodiment of the present invention. Referring to FIG. 1, a CT-ΣΔ ADC 10 includes a ΣΔ modulator 11 and a decimation filter 20. The ΣΔ modulator 11 receives the analog input signal Analog_In (node 12) and generates as the modulator output Mod_Out (node 18) a multi-bit digitized data stream having ones density representative of the magnitude of the analog input signal. The decimation filter 20 filters the ones density data stream to generates a digital output value Digital_Out (node 30) indicative of the relative frequency of occurrence of the many logical "1" values in the digitized data stream within some time interval. The digital output value Digital_Out is an estimate of the average magnitude of the analog input signal during that time interval.

The ΣΔ modulator 11 is formed by a continuous-time analog loop filter 14 and a multi-level quantizer 16. The loop filter 14 is implemented as a band pass filter for low-pass filtering the analog input signal Analog_In. The filtered signal is provided to the quantizer 16 which performs quantization at an over sampling rate to generate the multi-bit modulator output signal Mod_Out. In the present embodiment, quantizer 16 performs quantization at M number of levels. In one embodiment, quantizer 16 performs quantization at 23 levels. Furthermore, in the present embodiment, the multi-bit quantizer output Mod_Out is converted from thermometer code to binary code and then coupled to the decimation filter 20. The decimation filter 20 band pass filters the out-of-band quantization noise and decimates the modulator output to a lower sample rate to generate the Digital_out output signal (node 30) which is provided to subsequent digital post processing circuitry for further processing.

The feedback loop in the ΣΔ modulator includes a feedback digital-to-analog-converter 26 ("feedback DAC") for converting the digital multi-bit modulator output signal Mod_Out (node 30) into an analog feedback signal DAC_out (node 32). The analog feedback signal DAC_out is summed with the analog input signal Analog_In (node 12) and the summed signal is filtered by the loop filter 14. More specifically, the analog feedback signal DAC_out represents positive or negative reference voltages and the positive or negative reference voltages are summed with the analog input signal to adjust the average output of the loop filter 14 near the reference voltage levels of the comparators in quantizer 16.

In general, the loop filter 14 is formed by a summing amplifier and one or more integrators depending on the order of the loop filter. In one embodiment of the present invention, the loop filter is formed as an $8^{th}$ order bandpass filter. Furthermore, quantizer 16 is typically implemented as an array of comparators, one comparator for each quantization level. Thus, a quantizer 16 having M levels will include M numbers of comparators, each coupled to a different reference voltage level to digitize the analog signal from the loop filter 14 into M levels.

DAC with Pseudo-Return-to-Zero

According to one aspect of the present invention, a novel DAC circuit includes dual DAC units implementing pseudo-return-to-zero DAC operations. Under the pseudo-return-to-zero mode, one DAC unit in the DAC circuit is enabled for one half of a conversion clock cycle and is then returned to zero while the other DAC unit in the DAC is returned to zero during that half of the conversion clock cycle and is enabled for the other half of the same conversion clock cycle. By returning each DAC unit to zero for half of the conversion clock cycle, inter-symbol interference is reduced and conversion performance is improved.

In one embodiment, the feedback DAC 26 in the CT-ΣΔ ADC 10 of FIG. 1 is implemented using the novel DAC circuit with pseudo-return-to-zero DAC operations. As described above, quantizer 16 performs quantization at M levels. Accordingly, feedback DAC 26 is implemented with M number of DAC slices, each DAC slice receiving one bit of the multi-bit modulator output Mod_out. In the present embodiment, each DAC slice is implemented using the novel DAC circuit with pseudo-return-to-zero DAC operations. In other embodiments, the novel DAC circuit with pseudo-return-to-zero DAC operations of the present invention is applied in other applications, including as a stand-alone DAC.

Figure 2:
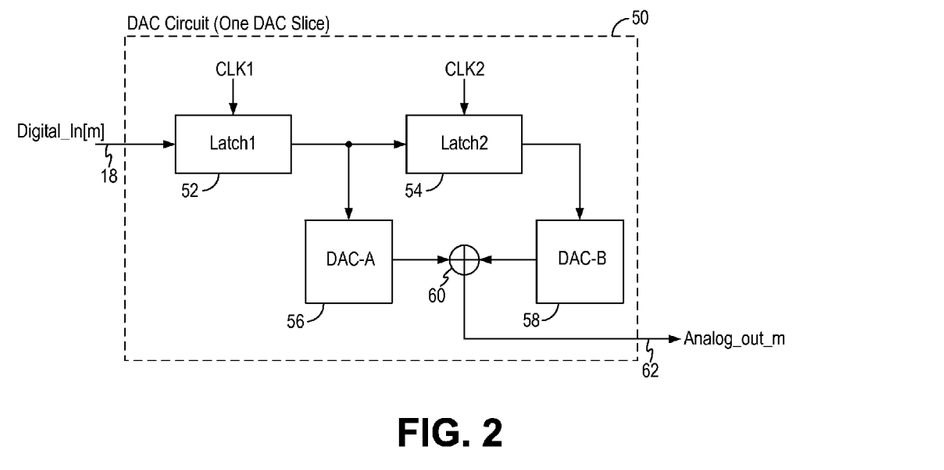
FIG. 2 is a block diagram illustrating a DAC circuit according to one embodiment of the present invention forming one DAC slice in the feedback DAC of the CT-ΣΔ ADC of FIG. 1.

FIG. 2 is a block diagram illustrating a DAC circuit according to one embodiment of the present invention forming one DAC slice in the feedback DAC of the CT-ΣΔ ADC of FIG. 1. Referring to FIG. 2, a DAC circuit 50 includes a first DAC unit 56 (DAC-A) and a second DAC unit 58 (DAC-B). The two DAC units 56, 58 receive the same digital input signal Digital_in[m] (node 18). When DAC circuit 50 is used as a DAC slice in the feedback DAC 26 (FIG. 1) of the CT-ΣΔ ADC 10, the digital input signal Digital_in[m] is one bit of the multi-bit modulator output signal Mod_Out. To realize pseudo-return-to-zero DAC operations, first DAC unit 56 and second DAC unit 58 are enabled at opposite phase of a conversion clock cycle and are reset or returned-to-zero at the other phase of the conversion clock cycle. In one embodiment, DAC-A is enabled for the first half of the conversion clock cycle while DAC-B is enabled for the second half of the conversion clock cycle. When one of the DAC units is enabled, the enabled DAC unit switches output current to its DAC unit output node. Meanwhile the other DAC unit is in a return-to-zero state and does not provide any output current to its DAC unit output node.

The analog output current from the two DAC units are summed at a node 60 and the summed signal is the output signal Analog_Out_m (node 62) of the DAC circuit 50. In FIG. 2, a summer is shown at node 60 but the summer is symbolic only to represent the summing of the analog output current from the two DAC units. There is not an actual summer circuit at node 60. When DAC circuit 50 is used as a DAC slice in the feedback DAC 26 (FIG. 1), the Analog_out_m signals from all DAC slices are summed together to generate the analog signal DAC_out (node 32).

In DAC circuit 50, the digital input signal Digital_in[m] is coupled to the DAC units through two latches driven by respective clock signals. More specifically, a first latch 52 (Latch1) receives a clock signal CLK1 and couples the digital input signal to the first DAC unit 56 and to a second latch 54 (Latch2); Latch2 receives a clock signal CLK2 and couples the digital input code to the second DAC unit 58. Clock signals CLK1 and CLK2 are non-overlapping and are activated at opposite phases of the conversion clock cycle to pass the digital input signal to the DAC units. In one embodiment, clock signal CLK1 is activated during the first half of a conversion clock cycle while clock signal CLK2 is activated during the second half of the conversion clock cycle. Thus, Latch1 latches the digital input signal Digital_in[m] during the first half of the conversion clock cycle while Latch2 latches the same digital input signal during the second half of the conversion clock cycle.

In operation, DAC circuit 50 enables one DAC unit for half of a conversion clock cycle while keeping the other DAC unit in a return-to-zero state. By resetting each DAC unit for one half of the conversion clock cycle, the DAC circuit 50 reduces inter-symbol interference. Because each DAC unit is reset between each conversion clock cycle, the digital code from one conversion clock cycle does not leak into the digital code from the next conversion clock cycle. The use of dual DAC units at opposite clock phase in the DAC circuit ensures that the output drive capability of the DAC circuit is not diminished by the return-to-zero operation.

Figure 3:
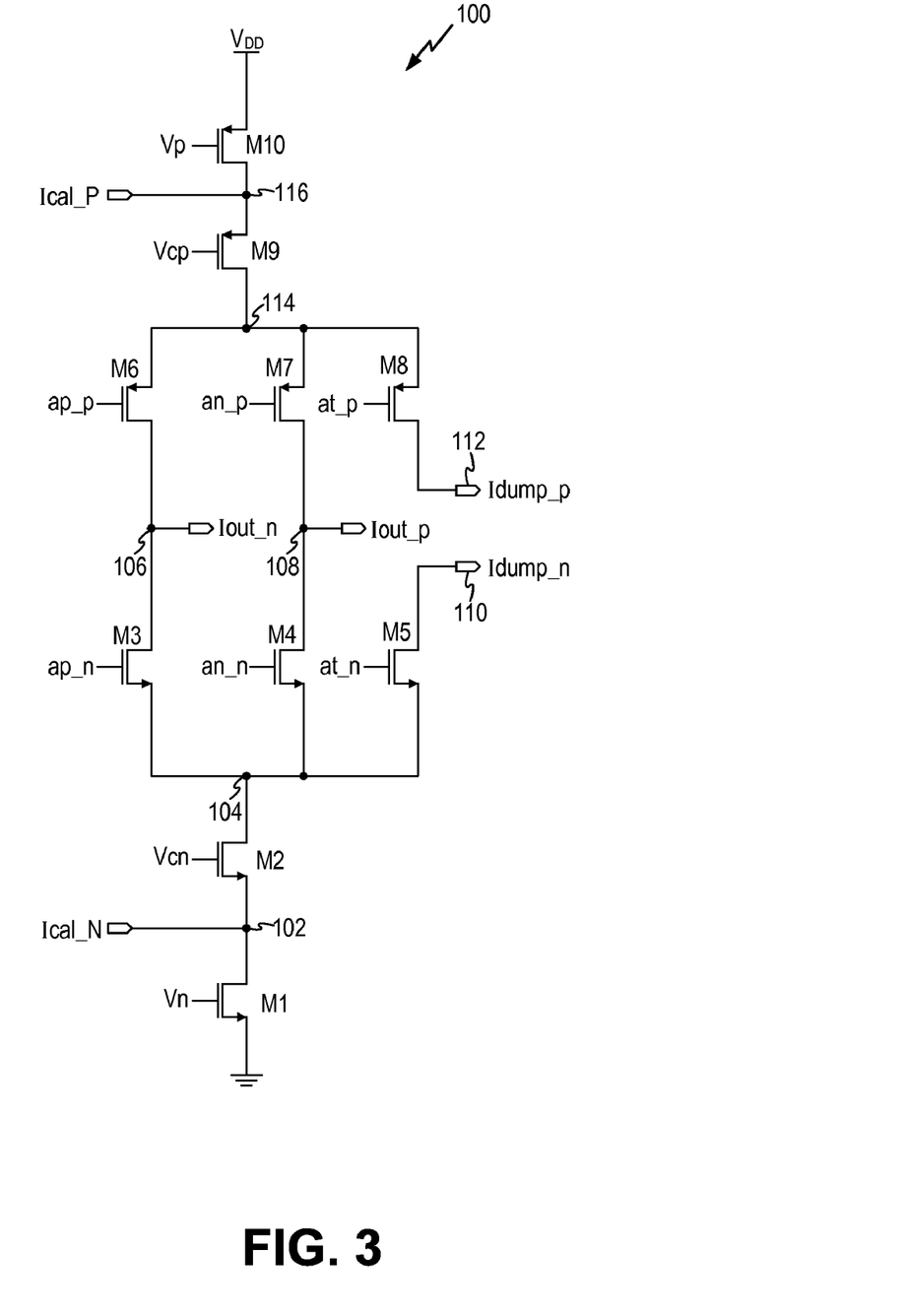
FIG. 3 is a circuit diagram of a digital-to-analog converter (DAC) cell which can be used to implement the DAC unit in the DAC circuit of FIG. 2 according to one embodiment of the present invention.

FIG. 3 is a circuit diagram of a digital-to-analog converter (DAC) cell which can be used to implement the DAC unit in the DAC circuit of FIG. 2 according to one embodiment of the present invention. According to one aspect of the present invention, the DAC cell is implemented using complementary MOS transistors. Conventional DAC cells are typically implemented using only NMOS transistors or only PMOS transistors. Implementing a DAC cell using complementary MOS transistors has the advantage that for the same amount of differential current, the DAC cell has very low noise. Alternately, with the same amount of noise, the DAC cell can operate at higher current.

Referring to FIG. 3, DAC cell 100 includes NMOS transistors M1 to M5 and PMOS transistors M6 to M10. In the present embodiment, DAC cell 100 receives a differential input signal and generates a differential output signal. NMOS transistors M3 and M4, receiving differential input signals ap_n and an_n, form a differential pair supplied by a tail current (node 104) provided by transistors M1 and M2, controlled by signals Vn and Vcn, respectively. PMOS transistors M6 and M7, receiving differential input signals ap_p and an_p, form a differential pair supplied by a tail current (node 114) provided by transistors M9 and M10, controlled by signals Vcp and Vp, respectively. A pair of differential output currents are generated at output nodes 106 and 108. Currents Iout_n and Iout_p as the DAC cell output current. Currents Iout_n and Iout_p are generated in response to the input signals ap_n, an_n, ap_p and an_p which are derived from the digital input signal provided to the DAC cell.

DAC cell 100 further includes NMOS transistor M5 and PMOS transistor M8 for directing the tail currents on nodes 104 and 114 to a pair of auxiliary differential current output terminals Idump_n and Idump_p (nodes 110, 112). To apply DAC cell 100 in a return-to-zero DAC operation, DAC cell 100 has to be capable of being reset or returned to zero. However, it is undesirable to disconnect the tail currents by turning off transistors M1, M2, M9 or M10. Turning the tail currents off and on would affect the operation speed of the DAC cell. In the present embodiment, when DAC cell 100 is to be placed in the return-to-zero mode, transistors M5 and M8 are turned on by control signals at n and at p, respectively, to redirect the tail currents to the auxiliary current output terminals Idump_n and Idump_p (nodes 110, 112) where the currents are discarded. In this manner, the tail currents of DAC cell 100 can remain on while the DAC cell 100 is in reset or return-to-zero mode. DAC cell 100 is then able to provide output current as soon as the DAC cell is enabled.

DAC Calibration/Trimming

As described above, in some embodiments of the present invention, the feedback DAC 26 in the CT-ΣΔ ADC 10 of FIG. 1 is implemented using the novel DAC circuit of FIG. 2 with pseudo-return-to-zero DAC operations. In one embodiment, quantizer 16 performs quantization at M levels and feedback DAC 26 includes M DAC slices, each DAC slice being implemented as the DAC circuit of FIG. 2 and including dual DAC units for realizing pseudo-return-to-zero DAC operation. Each DAC slice operates on one bit of the multi-bit modulator output Mod_out from the quantizer. More specifically, quantizer 16 includes M comparators to perform quantization at M levels. Each DAC slice is therefore coupled to receive and operate on the output of one of the M comparators. By using the DAC circuit implementing pseudo-return-to-zero DAC operations, the performance of feedback DAC 26 is improved because inter-symbol interference is reduced.

When an array of DAC circuits or DAC slices is used to form a DAC system, such as feedback DAC 26, mismatches between the DAC units in the array of DAC circuits due to fabrication process variations and other factors result in non-linearity of the DAC output which can negatively impact the performance of the DAC system. There are two main kinds of mismatches. There can be current mismatches between the current sources providing the tail currents in each of the DAC units. There can also be timing mismatches between the DAC units. Timing mismatches refer to the clock timing when one DAC unit switches from enable to return-to-zero state or vice versa. For instance, in one embodiment, for DAC-A and DAC-B units in each DAC slice, the desired enable/disable timing is 50% of the conversion clock cycle. If a DAC unit has timing that deviates from 50% of the conversion clock cycle, the DAC unit will contribute too much or not sufficient charges to the DAC output signal and the analog output signal of the DAC system will be adversely affected, as the DAC output signal is a function of the total charge provided by the DAC units of all the DAC slices. More specifically, timing differences between the DAC units will cause a DAC unit to be enabled for longer or shorter than the desired time and will therefore cause more or less charge to be supplied to the DAC output node, leading to errors in the total DAC output signal.

In accordance with embodiments of the present invention, a DAC calibration scheme and a DAC calibration system are provided to calibrate or trim an array of the DAC circuits of the present invention. More specifically, in some embodiments, the DAC calibration scheme performs both timing trim and current trim. The timing trim ensures the DAC units in all DAC slices will switch on and return-to-zero, and vice versa, at the same time in the conversion clock cycle. The current trim calibrates the current sources of the DAC units in all the DAC slices so that each DAC unit provides output current at the same current level. In this manner, the DAC calibration scheme ensures high linearity of the DAC operations. In one embodiment, a DAC calibration system 28 is coupled to the feedback DAC 26 to implement DAC calibration for the DAC slices in the feedback DAC of the CT-ΣΔ ADC 10. The DAC calibration scheme is performed as background calibration so that the feedback DAC 26 continues with normal operation while each DAC slice is being calibrated, as will be explained in more detail below.

DAC Calibration System

Figure 4:
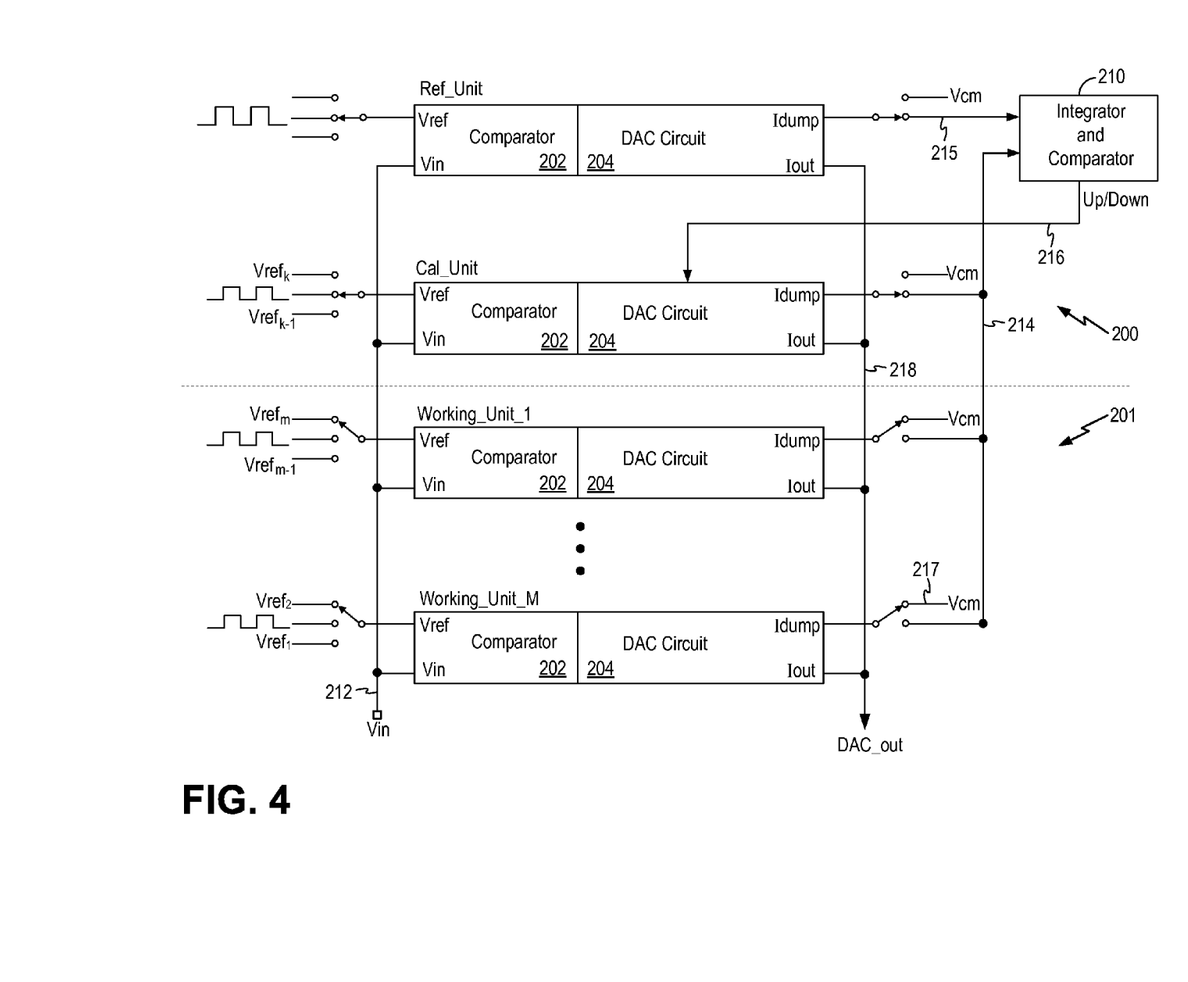
FIG. 4 is a block diagram of a DAC calibration system for calibrating an array of DAC circuits forming a DAC system according to one embodiment of the present invention.

FIG. 4 is a block diagram of a DAC calibration system for calibrating an array of DAC circuits forming a DAC system according to one embodiment of the present invention. Referring to FIG. 4, a DAC calibration system 200 implements background calibration for a DAC system 201 including M DAC circuits (also referred to as DAC slices). DAC calibration system 200 includes two DAC circuits identical to the DAC circuits of the DAC system 201. More specifically, DAC calibration system 200 includes a first DAC circuit configured as a reference unit and a second DAC circuit configured as a spare DAC circuit for substituting in the DAC circuit of the DAC system 201 being calibrated. In operation, the spare DAC circuit is indistinguishable from the DAC circuits of the DAC system 201 so that the entire DAC system 201 and the DAC calibration system 200 can be treated as a system of M+2 DAC circuits where one DAC circuit functions as the reference unit (denoted "Ref_unit") and the remaining M+1 DAC circuits are rotated through for calibration with the reference unit.

During any calibration cycle, one DAC circuit of the M+1 DAC circuits is placed under calibration (denoted "Cal_unit") and the remaining M DAC circuits (denoted "Working unit_1" to "Working unit_M") are used for normal DAC operations. When the calibration of the current DAC circuit is completed, another DAC circuit in the working unit group is swapped in for calibration and the calibrated DAC circuit is configured for normal operation. In this manner, each of the M+1 DAC circuits is swapped in for calibration with the reference unit in turn so that each M+1 DAC circuits are properly calibrated to achieve high conversion linearity over process variations in the DAC system. By providing a spare DAC circuit, calibration can be performed in the background without interrupting normal DAC operations.

In the present embodiment, the DAC system 201 and the DAC calibration system 200 are configured by incorporating the comparators of the quantizer 16 with each of the M+2 DAC circuits. Thus, each of M+1 joint comparator/DAC circuits is rotated in for calibration with the reference unit also including a joint comparator/DAC circuit configuration. As thus configured, the quantizer 16 includes M comparators for M quantization levels and two additional comparators for the reference unit and the spare unit. In the following description, the term "reference unit (Ref_unit)" refers to the joint comparator/DAC circuit used as a reference for calibration purpose; the term "calibration unit (Cal_unit)" refers to the joint comparator/DAC circuit under calibration, and the term "working unit (Working_unit)" refers to the joint comparator/DAC circuit configured for normal DAC operations. In the following description, a "joint comparator/DAC circuit" will be referred to as a "DAC element."

By incorporating the comparators with the DAC circuits, the rotating of the M+1 calibration unit and the working units is carried out by connecting different voltage levels/signals to the reference voltage Vref input terminals of the comparators. The output of each comparator is then directly connected to the input of each DAC circuit. As thus configured, switching at the input terminal of the DAC circuit is avoided. Rather, selection of the calibration unit is carried out by switching the input to the comparators. In one embodiment, the comparator inputs are switched during the reset state of the DAC circuits so that any switching noise introduced by the switching action will not negatively impact DAC operations. However, the incorporation of the comparator with the DAC circuit is not critical to the practice of the DAC calibration scheme and system of the present invention. In other embodiments, the DAC calibration system can be configured by rotating the DAC circuits alone, without incorporating the comparators, as shown in FIG. 7.

Figure 7:
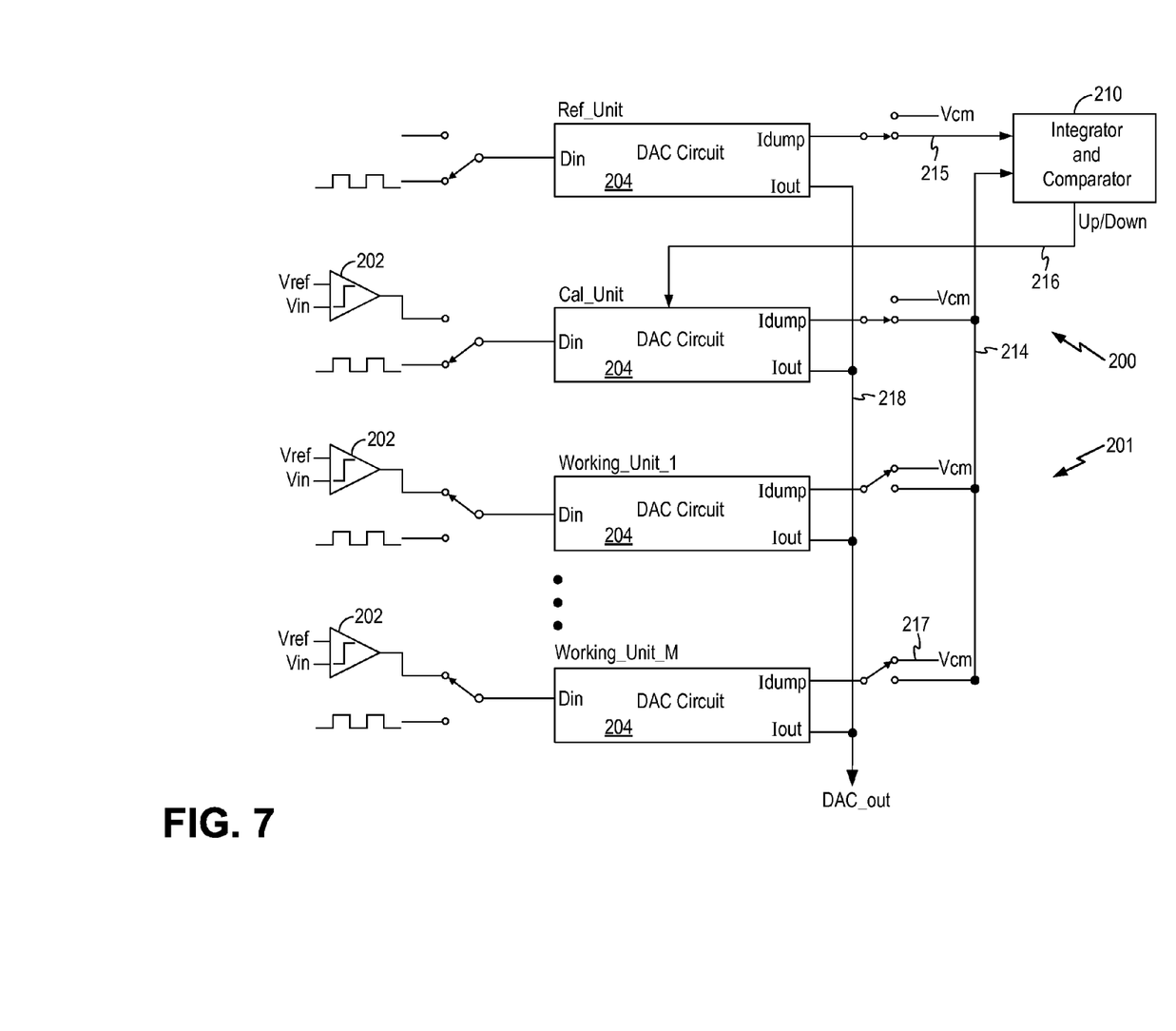
FIG. 7 is a block diagram of a DAC calibration system for calibrating an array of DAC circuits forming a DAC system according to an alternate embodiment of the present invention.

FIG. 7 illustrates an alternate embodiment of the DAC calibration circuit and DAC system where one DAC circuits is selected and rotated for calibration with a reference DAC circuit. Referring to FIG. 7, the Din input terminal of the reference unit is configured to receive a calibration signal. The Din input terminal of the calibration unit is switchably connected to the calibration signal. The Din input terminals of the remaining M working units are connected to the output of a respective comparator 202 of the quantizer. Note that in the embodiment shown in FIG. 7, a comparator 202 is shown coupled to the calibration unit or the spare unit. In actual implementation, an additional comparator does not need to be provided for the spare DAC circuit. The spare DAC circuit can simply be connected to the M comparators in the quantizer through appropriate switching connections. The calibration signal provided to the DAC circuits will be a digital code, such as a digital code switching between 0's and 1's.

The configuration of the DAC system 201 and the DAC calibration system 200 will now be described with reference to FIG. 4. As described above, the DAC system 201 and the DAC calibration system 200 together include M+2 DAC elements (joint comparator/DAC circuits), where M is the number of quantization levels of the quantizer when the DAC system 201 is used as a feedback DAC in a CT-$\Sigma\Delta$ ADC. In other embodiments, when the DAC system is used as a standalone DAC, M represents the resolution of the DAC system. The M+2 DAC elements, including the reference unit, the calibration unit and the working units, are identical in basic construction. Each DAC element includes a comparator 202 coupled to a DAC circuit 204.

Each comparator 202 in the DAC element has a first input terminal receiving an analog input voltage Vin and a second input terminal receiving a reference voltage Vref. The input voltage (Vin) terminal of all M+2 DAC elements are connected to the analog input voltage Vin, without any intervening switching. The reference voltage (Vref) terminal of each DAC element is switchably connected to the appropriate voltage/signal depending on the status of the DAC element. The reference voltage (Vref) terminal of the reference unit Ref_unit is connected to a calibration signal for performing calibration of the DAC circuit. In one embodiment, for timing calibration, the calibration signal is a square wave signal having a 50% duty cycle. In other embodiments, other signal waveform can be used for the calibration signal and other duty cycle factor can be used. Meanwhile, the reference voltage (Vref) terminals of the remaining M+1 DAC elements are switchably connected to the calibration signal or to a respective reference voltage value. More specifically, the DAC element under calibration (Cal_unit) has its reference voltage terminal connected to the calibration signal while the reference voltage (Vref) terminals of the remaining M working units are connected to respective reference voltages $Vref_1$ to $Vref_m$ for digitizing the input voltage Vin to the M quantization levels.

In the present embodiment, the output signal of each comparator 202 is coupled directly to the input terminal of the respective DAC circuit 204, without any intervening switching. Switching noise at the DAC input terminal is thus avoided, as described above. DAC circuit 204 has a first output terminal providing an output current Iout and a second output terminal providing an auxiliary output current Idump. The output current Iout represent the conversion output current of the DAC circuit. The first output terminals providing the output current Iout of all M+2 DAC circuits are connected, without any intervening switching, to the DAC output terminal to generate the output signal DAC_out of the DAC system. A salient feature of the DAC calibration system and DAC system of the present invention is that the DAC output terminals of all DAC circuits are connected together without any intervening switching. By eliminating switches at the output terminal of the DAC system, switching noise introduced by switching action at the output terminals is avoided and the DAC system can operate without suffering from noise introduced by the calibration operations.

Meanwhile, the auxiliary output current Idump of the reference unit is connected to a first input terminal (node 215) of calibration integrator and comparator 210. The auxiliary output current Idump of the remaining M+1 DAC circuits are switchably connected to a common mode voltage Vcm (node 217) or to a second input terminal (node 214) of the calibration integrator and comparator 210. The calibration integrator and comparator 210 operates to integrate and compare the auxiliary output current Idump from the reference unit and the calibration unit to determine if adjustments of the DAC circuit of the calibration unit is required. The integrator and comparator 210 generate a calibration control signal (Up/Down) (node 216) to adjust the timing pulse width or the current level or both of the DAC circuit of the calibration unit in response to the comparison result.

In the present illustration, all input/output terminals are shown as single-ended terminals. In actual implementations, the input/output terminals of the comparator and the DAC circuit may be single-ended or differential terminals. FIG. 4 is illustrative only and is not intended to be limiting. In one embodiment, the calibration integrator and comparator operates by integrating the current output from the reference unit (Iref) and the current output from the calibration unit (Ical) and comparing the difference between current Iref and current Ical. In other embodiments, the calibration integrator integrates the difference between currents Iref and Ical and then the calibration comparator compares the integrated difference value to a fixed voltage level, such as ground.

In operation, the reference unit ("Ref_unit") receives the calibration input signal and the output current of the DAC circuit is directed to the Idump node and provided to the first input terminal (node 215) of calibration integrator and comparator 210. Then, each of the remaining M+1 DAC elements is selected in turn for calibration. The DAC element selected for calibration ("Cal_unit") has its reference voltage Vref terminal connected to receive the calibration signal and its auxiliary output current Idump connected to the second input terminal (node 214) of calibration integrator and comparator 210. The remaining M DAC elements are configured for normal DAC operations. The reference voltage Vref terminals of the working DAC elements ("Working_unit") are connected to respective reference voltages Vref to $Vref_m$ and the auxiliary output current Idump of the working DAC elements are connected to the common mode voltage node 217. As thus configured, the calibration unit and the reference unit receive the same reference voltage input signal and the auxiliary output current Idump of the calibration unit is compared with the auxiliary output current Idump of the reference unit at the calibration integrator and comparator 210. The timing pulse width and/or the current level of the DAC circuit of the calibration unit are adjusted to match that of the reference unit as close as possible. In this manner, each of the M+1 DAC elements is rotated in to be calibrated with the reference unit so that all M+1 DAC elements match the reference unit and match each other. Mismatches between the DAC circuits in the DAC elements are thus eliminated. In one embodiment, the selection of the M+1 DAC elements for calibration and the waiting period between adjacent calibration cycles are randomized to avoid introducing undesired tone by the calibration operation.

It is instructive to note that because each DAC circuit includes two DAC units (as shown in FIG. 2), the calibration of each DAC element involves calibrating and trimming each DAC unit in the DAC circuit in turn. Control circuitry in the DAC circuit selects each DAC unit for calibration and controls the adjustment of each DAC unit as a result of the calibration. In the present description, calibration or trimming of the DAC circuit in the M+1 DAC elements refers to calibration or trimming of each of the two DAC units in the DAC circuit.

The configuration of the DAC calibration system 200 and the DAC system 201 as shown in FIG. 4 provides particular advantages. First, the reference voltage input terminal to comparators 202 of the M+2 elements are switched. However, the switching of the reference voltage input terminal does not negatively impact the DAC operation because the reference voltage can be switched during the return-to-zero phase of the DAC operation. Second, the conversion output currents Iout of all M+2 DAC elements are connected to the DAC output node without any intervening switching. That is, there is no switching, or no connection or disconnection of nodes, at the DAC output node. Thus, the DAC output signal DAC_out is not subjected to switching and switching noise at the DAC output signal is avoided.

In the present embodiment, the conversion output currents Iout of the reference unit and the calibration unit are connected to the DAC output node in addition to the conversion output currents from the M working units. To avoid the reference unit and the calibration unit altering the DAC output signal DAC_out, the DAC circuits of the reference unit and calibration unit are configured so as to cancel the contribution of the conversion output currents by the reference unit and the calibration unit. More specifically, the DAC calibration scheme configures the calibration unit to output current Iout having one polarity and configures the reference unit to output current Iout having an opposite polarity. In this manner, current Iout from the calibration unit and current Iout from the reference unit cancel each other out and the DAC output DAC_out is unaffected by the additional DAC elements connected to the DAC output terminal.

Figure 5:
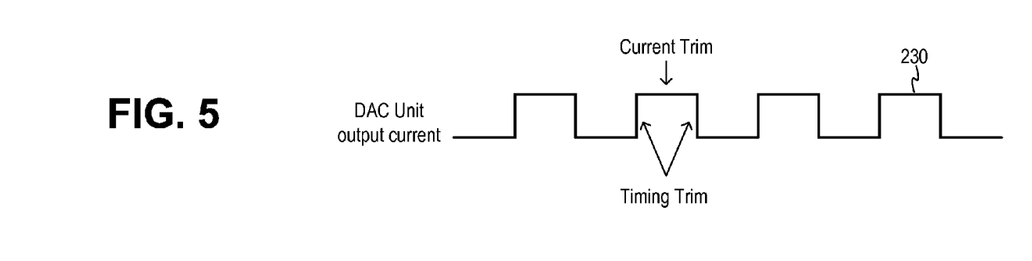
FIG. 5 illustrates the DAC unit output current in response to a square wave input signal according to one embodiment of the present invention.

According to some embodiments of the present invention, the DAC calibration scheme operates to eliminate timing mismatches and current mismatches. Timing calibration addresses the differences in timing between the enable and return-to-zero mode of the DAC units. Current calibration addresses the differences in output current levels of the DAC units. FIG. 5 illustrates the DAC unit output current in response to a square wave input signal according to one embodiment of the present invention. Referring to FIG. 5, timing calibration operates to trim the pulse width of the DAC unit output current until the DAC unit output current of the calibration unit matches that of the reference unit. On the other hand, current calibration operates to trim the current level of the DAC unit output current until the DAC unit output current of the calibration unit matches that of the reference unit. It is imperative to note that the goal of the calibration is not to make all timing at exactly 50% clock cycle or the output current at a specific current value. The goal of the calibration is to make all the DAC elements close to the reference unit. Accordingly, all the DAC units in all DAC slices will match in performance, even though they deviate from certain ideal values. For example, all DAC elements may be running at 49% duty cycle or 51% duty cycle. Mismatch errors are eliminated when all DAC elements are matching.

Figure 6:
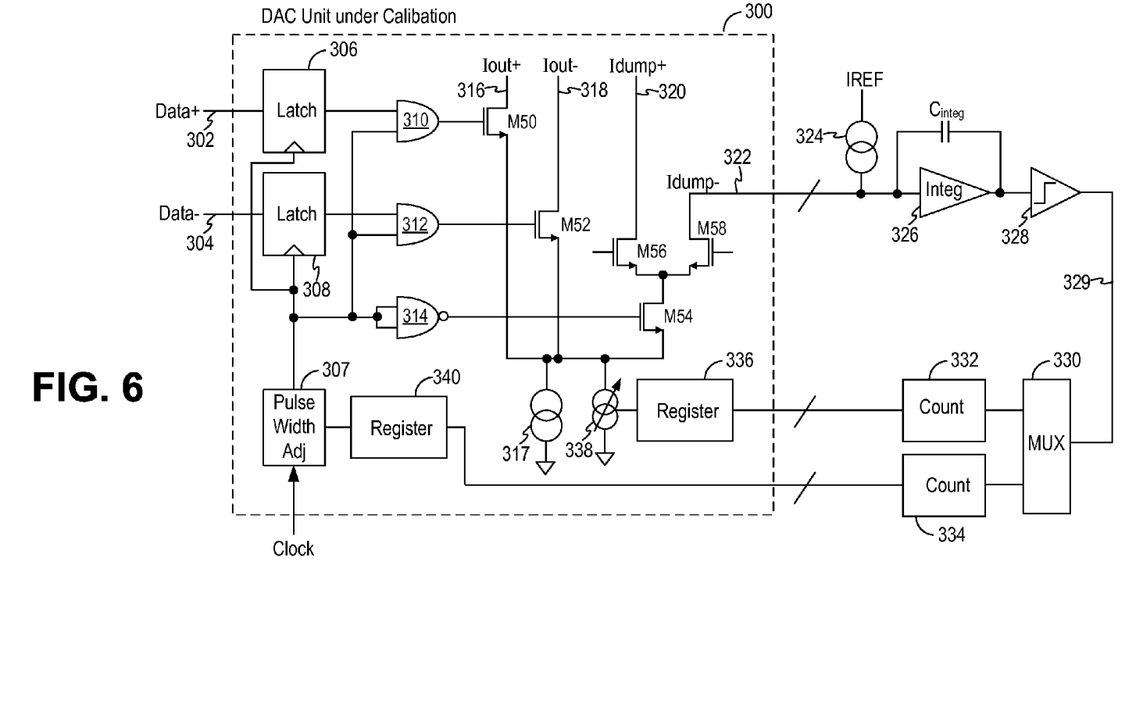
FIG. 6 is a representative schematic diagram of a DAC unit under calibration illustrating the circuitry for adjusting the pulse width and the output current level in accordance with the calibration scheme according to one embodiment of the present invention.

The timing calibration operation and the current calibration operation under the DAC calibration scheme of the present invention will now be described with reference to FIG. 4 and FIG. 6. FIG. 6 is a representative schematic diagram of a DAC unit under calibration illustrating the circuitry for adjusting the pulse width and the output current level in accordance with the calibration scheme according to one embodiment of the present invention. It is instructive to note that FIG. 6 is illustrative only and does not intend to show the exact circuit implementation of the DAC system or the DAC calibration system. FIG. 6 is provided merely to illustrate the operation of the DAC unit under the DAC calibration scheme. Furthermore, FIG. 6 illustrates signals in the single-ended mode. In one embodiment of the present invention, the DAC circuit, the DAC system and the DAC calibration system are implemented using differential signaling.

Referring to FIG. 6, a DAC unit 300 under calibration is shown to include latches 306, 308 for receiving a pair of differential input signals Data+ and Data− on nodes 302 and 304. Latches 306 and 308 are controlled by a clock signal to control the enable and return-to-zero states of the DAC unit. The clock signal is coupled through a pulse width adjustment circuit 307 which operates to modify the pulse width of the clock signal in accordance with the calibration result, as will be explained in more detail below. AND gates 310 and 312 generate the control signals driving the DAC cell transistors M50 and M52. NAND gate 314 generates the control signal driving the DAC cell transistors M54 which controls the auxiliary current Idump path. The DAC cell is supplied by a current source 371 and a variable current source 338.

The auxiliary current Idump− on output node 322 is coupled to the calibration integrator, including integrating amplifier 326 and integrating capacitor Cinteg. In the present illustration, the calibration integrator integrates the difference between the auxiliary current of the calibration unit and the reference current from the reference unit. The reference current Iref (represented as a current source 324) is coupled to node 322 to be subtracted from current Idump−. The difference between the auxiliary current Idump− and the reference current Iref is then integrated by integrating amplifier 326 for a given number of clock cycles. The integration result is compared with a reference level by comparator 328. The comparison result on node 329 is provided to a multiplexer 330. Multiplexer 300 selects either counter 332 or 334 depending on whether the present calibration cycle is for timing calibration or for current calibration. If the calibration cycle is for timing calibration, then counter 334 is selected. If the calibration cycle is for current calibration, then counter 332 is selected. In one embodiment, the comparison result from comparator 328 is an up/down control signal causing counter 332 or 334 to increment or decrement a count. The count values are stored in registers 338 and 340. Register 336 drives the variable current source 338 to vary the tail current supplied to the DAC cell to vary the output current level. Register 340 drives the pulse width adjustment circuit 307 to modify the pulse width of the clock signal to adjust the duty cycle of the DAC cell. In one embodiment, the pulse width of the clock signal is adjusted by adjusting programmable timing delay in the pulse width adjustment circuit 307. In this manner, trimming of the DAC unit duty cycle and the output current level is realized.

(1) Timing Trim

To perform timing calibration, a square wave signal is supplied as the calibration signal to the reference voltage input terminals of the reference unit and the calibration unit (FIG. 4). In the present embodiment, the square wave signal has a duty cycle of 50% and a rail-to-rail voltage magnitude to ensure the comparator will trigger. The square wave calibration signal causes the DAC unit to continuously toggle in order to measure the average timing error of the DAC output current. The average timing error of the DAC output current is measured through current Idump which is the same DAC output current but being redirected to the auxiliary current output terminal Idump.

At each calibration cycle for timing trim, the calibration unit is configured to receive the square wave calibration signal as the reference voltage to the comparator. The auxiliary output current Idump of the calibration unit is coupled to the calibration integrator 210. The auxiliary output current Idump of the calibration unit and the auxiliary output current Idump of the reference unit are integrated for N number of clock cycles. The calibration comparator compares the integrated current values and generates the up/down control depending on the error value of the calibration unit.

In one embodiment, the pulse width adjustment circuit 307 is implemented as a digital current controllable delay cell to adjust the timing delay of the DAC unit. The register 340 stores the count value of the delay to be applied. The delay cell adjusts the clock edges of the clock signal to adjust the clock signal pulse width.

The calibration integrator/comparator are then reset for the next calibration cycle where another DAC element is selected to be calibrated and the calibrated DAC element is swapped in as a working unit.

(2) Current Trim

The timing calibration described above can be used to correct the charge errors in the DAC output associated with both timing mismatches and current mismatches. However, in one embodiment, a separate current calibration is provided in the DAC calibration scheme to correct for DAC current mismatches. The current calibration operation is the same as timing calibration with a few modifications. For current calibration, the calibration unit and the reference unit are forced into reset or return-to-zero mode so that auxiliary output current will flow continuously. The calibration integrator and comparator integrates current Idump from the reference unit and the calibration unit and provides the up/down control signal to adjust the variable current source of the DAC unit. In one embodiment, current trimming is applied only to the NMOS transistor of the DAC cell.

The above detailed descriptions are provided to illustrate specific embodiments of the present invention and are not intended to be limiting. Numerous modifications and variations within the scope of the present invention are possible. The present invention is defined by the appended claims.

We claim:

1. A digital-to-analog converter (DAC) circuit comprising:
a first digital-to-analog converter (DAC) unit having a first input terminal coupled to receive a first signal related to a digital input signal and an output terminal coupled to provide an analog output signal;
a second DAC unit having a first input terminal coupled to receive a second signal related to the digital input signal and an output terminal coupled to provide an analog output signal, the analog output signals from the first and second DAC units being summed at a summing node; and
a first latch and a second latch connected in series, the first latch coupled to latch the digital input signal based on a first clock signal and to generate the first signal, the first latch providing the first signal to the first DAC unit and to the second latch, the second latch coupled to latch the first signal based on a second clock signal and to generate the second signal, the second latch providing the second signal to the second DAC unit, the first and second clock signals being non-overlapping clock signals, wherein the first DAC unit is enabled during a first half of a conversion clock cycle and is reset during a second half of the conversion clock cycle and the second DAC unit is reset during the first half of the conversion clock cycle and is enabled during the second half of the conversion clock cycle, the summed analog output signal from the first and second DAC units over a conversion clock cycle being an analog output signal of the DAC circuit based on the digital input signal.

2. The DAC circuit of claim 1, wherein each of the first and second digital-to-analog converter units is implemented using complementary MOS transistors.

3. The DAC circuit of claim 1, wherein the first and second digital-to-analog converter units are reset by returning the analog output signals to a zero state.

4. A method for converting a digital input signal to an analog output signal comprising:
  receiving the digital input signal;
  latching the digital input signal based on a first clock signal;
  providing the latched digital input signal to a first digital-to-analog converter (DAC) unit and to a second latch;
  latching the latched digital input signal based on a second clock signal;
  providing the twice-latched digital input signal to a second DAC unit;
  performing digital-to-analog conversion of the digital input signal at the first DAC unit during a first half of a conversion clock cycle;
  resetting the second DAC unit during the first half of the conversion clock cycle;
  performing digital-to-analog conversion of the digital input signal at the second DAC unit during a second half of a conversion clock cycle;
  resetting the first DAC unit during the second half of the conversion clock cycle; and
  summing an output signal from the first DAC unit and an output signal from the second DAC unit over the conversion clock cycle to generate the analog output signal.

5. The method of claim 4, wherein resetting the first or second digital-to-analog converter unit comprises returning the output signal of the first or second digital-to-analog converter unit to a zero state.

6. A method for calibrating an array of M digital-to-analog converter (DAC) circuits, the M DAC circuits for converting a digital input signal having M number of quantization levels into an analog output signal, the method comprising:
  providing a reference DAC circuit and a spare DAC circuit, both identical to the M DAC circuits, the reference DAC circuit providing an analog output signal having a reverse polarity as the spare DAC circuit;
  connecting output terminals of the M DAC circuits and the reference and spare DAC circuits to an analog output terminal without intervening switches;
  summing output signals from the M DAC circuit and the reference and spare DAC circuits at the output terminal to generate the analog output signal of the array, the output signal of the reference DAC circuit cancelling the output signal of the spare DAC circuit;
  selecting one of M DAC circuits for calibration, the selected DAC circuit becoming a calibration DAC circuit;
  configuring the spare DAC circuit and the remaining M−1 DAC circuits as the array of M DAC circuits coupled to convert the digital input signal into the analog output signal;
  providing a calibration signal to an input terminal of the reference DAC circuit and the calibration DAC circuit;
  integrating the output signal of the reference DAC circuit and the output signal of the calibration DAC circuit over a predetermined number of clock cycles;
  comparing the integrated output signal of the reference DAC circuit and the integrated output signal of the calibration DAC circuit; and
  generating a calibration control signal to modify a timing parameter in the calibration DAC circuit.

7. The method of claim 6, further comprising:
  selecting another one of M DAC circuits for calibration, the selected DAC circuit becoming the currently selected calibration DAC circuit; and
  configuring the DAC circuit just calibrated, the spare DAC circuit and the remaining M−2 DAC circuits as the array of M DAC circuits coupled to convert the digital input signal into the analog output signal.

8. The method of claim 6, further comprising:
  selecting the spare DAC circuit for calibration, the selected DAC circuit becoming the currently selected calibration DAC circuit; and
  configuring the DAC circuit just calibrated, and the remaining M−1 DAC circuits as the array of M DAC circuits coupled to convert the digital input signal into the analog output signal.

9. The method of claim 6, wherein providing a calibration signal comprises providing a square wave signal having a predetermined duty cycle.

10. The method of claim 6, wherein the array of M DAC circuits comprises an array of M DAC elements, each M DAC element comprising a comparator coupled to a DAC circuit, and the reference DAC circuit comprises a reference DAC element and the spare DAC circuit comprises a spare DAC element, both identical to the M DAC elements, the method further comprising:
  connecting input voltage terminals of the comparators of the M DAC elements, the reference DAC element and the spare DAC element to an input voltage;
  connecting reference voltage terminals of the comparators of the M−1 DAC elements and the spare DAC element to a respective one of M reference voltages for comparing with the input voltage; and
  connecting the calibration signal to the reference voltage terminals of the comparators of the reference DAC element and the calibration DAC element.

11. The method of claim 6, wherein each DAC circuit comprises a first DAC unit and a second DAC unit, the first DAC unit being enabled during a first half of the conversion cycle and being reset during a second half of the conversion cycle, and the second DAC unit being reset during a first half of the conversion cycle and being enabled during a second half of the conversion cycle, the first and second DAC units working in conjunction to convert the digital input signal at one quantization level to the corresponding analog output signal, the method further comprising:
  selecting the first DAC unit within the calibration DAC circuit for calibration; and
  when calibration of the first DAC unit is completed, selecting the second DAC unit within the calibration DAC circuit for calibration.

12. The method of claim 11, wherein generating a calibration control signal to modify a timing parameter in the calibration DAC circuit comprises generating a calibration control signal to modify a pulse width of the first conversion cycle or the pulse width of the second conversion cycle.

13. The method of claim 6, further comprising:
providing a second calibration signal to place the reference DAC circuit and calibration DAC circuit in a reset mode;
integrating the output signal of the reference DAC circuit and the output signal of the calibration DAC circuit based on the second calibration signal over a predetermined number of clock cycles;
comparing the integrated output signal of the reference DAC circuit and the integrated output signal of the calibration DAC circuit; and
generating a second calibration control signal to modify an output current value in the calibration DAC circuit.

14. The method of claim 6, wherein integrating the output signal of the reference DAC circuit and the output signal of the calibration DAC circuit over a predetermined number of clock cycles and comparing the integrated output signal of the reference DAC circuit and the integrated output signal of the calibration DAC circuit comprise:
integrating a different between the output signal of the reference DAC circuit and the output signal of the calibration DAC circuit over a predetermined number of clock cycles; and
comparing the integrated difference signal with a fixed voltage level.

15. A calibration circuit for an array of M digital-to-analog converter (DAC) circuits, the M DAC circuits for converting a digital input signal having M number of quantization levels into an analog output signal, the calibration circuit comprising:
a reference DAC circuit and a spare DAC circuit, both identical to the M DAC circuits, the reference DAC circuit providing an analog output signal having a reverse polarity as the spare DAC circuit, wherein output terminals of the M DAC circuits and the reference and spare DAC circuits are all connected to an analog output terminal without intervening switches and analog output signals from the M DAC circuit and the reference and spare DAC circuits are summed at the output terminal to generate an analog output signal for the array, the analog output signal of the reference DAC circuit cancelling the analog output signal of the spare DAC circuit;
a calibration integrator coupled to integrate an analog output signal from the reference DAC circuit and an analog output signal from a calibration DAC circuit; and
a calibration comparator coupled to compare the integrated analog output signal of the reference DAC circuit and the integrated analog output signal of the calibration DAC circuit,
wherein the calibration circuit is operative to:
(a) select one of M DAC circuits for calibration, the selected DAC circuit becoming a calibration DAC circuit;
(b) configure the spare DAC circuit and the remaining M−1 DAC circuits as the array of M DAC circuits coupled to convert the digital input signal into the analog output signal;
(c) provide a calibration signal to an input terminal of the reference DAC circuit and the calibration DAC circuit;
(d) integrate the output signal of the reference DAC circuit and the output signal of the calibration DAC circuit over a predetermined number of clock cycles;
(e) compare the integrated output signal of the reference DAC circuit and the integrated output signal of the calibration DAC circuit; and
(f) generate a calibration control signal to modify a timing parameter in the calibration DAC circuit.

16. The calibration circuit of claim 15, wherein the calibration circuit is further operative to:
(g) select another one of M DAC circuits for calibration, the selected DAC circuit becoming the currently selected calibration DAC circuit; and
(h) configure the DAC circuit just calibrated, the spare DAC circuit and the remaining M−2 DAC circuits as the array of M DAC circuits coupled to convert the digital input signal into the analog output signal.

17. The calibration circuit of claim 15, wherein the calibration circuit is further operative to:
(i) selecting the spare DAC circuit for calibration, the selected DAC circuit becoming the currently selected calibration DAC circuit; and
(j) configuring the DAC circuit just calibrated, and the remaining M−1 DAC circuits as the array of M DAC circuits coupled to convert the digital input signal into the analog output signal.

18. The calibration circuit of claim 15, wherein the calibration signal comprises a square wave signal having a predetermined duty cycle.

19. The calibration circuit of claim 15, wherein the array of M DAC circuits comprises an array of M DAC elements, each M DAC element comprising a comparator coupled to a DAC circuit, and the reference DAC circuit comprises a reference DAC element and the spare DAC circuit comprises a spare DAC element, both identical to the M DAC elements, the calibration circuit is further operative to:
(k) connect input voltage terminals of the comparators of the M DAC elements, the reference DAC element and the spare DAC element to an input voltage;
(l) connect reference voltage terminals of the comparators of the M−1 DAC elements and the spare DAC element to a respective one of M reference voltages for comparing with the input voltage; and
(m) connect the calibration signal to the reference voltage terminals of the comparators of the reference DAC element and the calibration DAC element.

20. The calibration circuit of claim 15, wherein each DAC circuit comprises a first DAC unit and a second DAC unit, the first DAC unit being enabled during a first half of the conversion cycle and being reset during a second half of the conversion cycle, and the second DAC unit being reset during a first half of the conversion cycle and being enabled during a second half of the conversion cycle, the first and second DAC units working in conjunction to convert the digital input signal at one quantization level to the corresponding analog output signal, the calibration circuit is further operative to:
(n) select the first DAC unit within the calibration DAC circuit for calibration; and
(o) when calibration of the first DAC unit is completed, select the second DAC unit within the calibration DAC circuit for calibration.

21. The calibration circuit of claim 20, wherein the calibration circuit is coupled to generate the calibration control signal to modify a pulse width of the first conversion cycle or the pulse width of the second conversion cycle.

22. The calibration circuit of claim 15, wherein the calibration circuit is further operative to:

(p) provide a second calibration signal to place the reference DAC circuit and calibration DAC circuit in a reset mode;
(q) integrate the output signal of the reference DAC circuit and the output signal of the calibration DAC circuit based on the second calibration signal over a predetermined number of clock cycles;
(r) compare the integrated output signal of the reference DAC circuit and the integrated output signal of the calibration DAC circuit; and
(s) generate a second calibration control signal to modify an output current value in the calibration DAC circuit.

23. The calibration circuit of claim 15, wherein the calibration circuit is operative to integrate and to compare comprises the calibration circuit is operative to:
(d) integrate a difference between the output signal of the reference DAC circuit and the output signal of the calibration DAC circuit over a predetermined number of clock cycles; and
(e) compare the integrated difference signal to a fixed voltage level.

* * * * *